United States Patent [19]

Amidon et al.

[11] 4,078,927

[45] Mar. 14, 1978

[54] PHOTOCONDUCTIVE PRINTING MASTER

[75] Inventors: Alan B. Amidon; Joseph Mammino, both of Penfield, N.Y.

[73] Assignee: Xerox Corporation, Stamford, Conn.

[21] Appl. No.: 424,497

[22] Filed: Dec. 13, 1973

[51] Int. Cl.$^2$ .......................... G03G 5/04; G03F 7/02

[52] U.S. Cl. .................................... 96/1 R; 96/1.5 R; 96/33; 101/356; 101/357; 101/454; 101/456; 101/457; 101/460; 101/462; 101/465

[58] Field of Search .................... 96/1.5, 33; 260/46.5; 101/356, 357, 454, 456, 457, 460, 462, 465

[56] References Cited

U.S. PATENT DOCUMENTS

| | | | |
|---|---|---|---|
| 3,408,186 | 10/1968 | Mammino | 96/1.5 |
| 3,408,187 | 10/1968 | Mammino | 96/1.5 |
| 3,408,190 | 10/1968 | Mammino | 96/1.5 |
| 3,554,125 | 1/1971 | Van Dorn et al. | 96/1.5 |
| 3,606,922 | 9/1971 | Doggett | 101/457 |
| 3,775,115 | 11/1973 | Sorkin et al. | 96/33 |
| 3,804,620 | 4/1974 | Wells | 96/1.5 |
| 3,819,744 | 6/1974 | Büchner et al. | 260/46.5 R |
| 3,820,984 | 6/1974 | Gundlach | 96/1.5 |
| 3,821,325 | 6/1974 | Merritt et al. | 260/46.5 R |
| 3,859,090 | 1/1975 | Yoerger et al. | 96/1.5 |
| 3,861,915 | 1/1975 | Cawley | 96/1.5 |
| 4,030,416 | 6/1977 | Schank | 101/450 |

*Primary Examiner*—Edward C. Kimlin
*Attorney, Agent, or Firm*—James J. Ralabate; James P. O'Sullivan; Gaetano D. Maccarone

[57] ABSTRACT

A planographic printing master comprising an ink releasing photoconductive insulating layer and an ink receptive particulate image pattern.

3 Claims, No Drawings

PHOTOCONDUCTIVE PRINTING MASTER

BACKGROUND OF THE INVENTION

1. Field of the Invention

This invention relates to planographic printing masters prepared by electrostatographic techniques. More specifically, this invention concerns photoconductive printing masters which are especially suitable for use in direct and offset lithographic printing processes.

2. Description of the Prior Art

Conventional printing processes can generally be classified in the following catagories: (a) relief printing; (b) intaglio printing (c) planographic printing; and (d) porous printing. In relief printing the master or "image carrier" comprises elevated and depressed regions wherein the printed image is prepared by transfer of ink from the elevated areas of the master to the receiving sheet. The reverse situation is found to exist in intaglio printing systems wherein the printing areas of the image carrier are the depressions within the surface of the master and the elevated regions now provide the background for said image. In planographic printing systems, the printing and background regions of the printing master are on substantially the same plane. Porous printing or screen printing processes are distinct from the above systems in two major respects; holes in the screen provide the image areas of the master and the inking of the screen is a part of the image transfer process.

Planographic printing systems are further subdivided into four distinct printing methods. These systems include stone lithography, direct lithography, offset lithography, and collotype. Since the printing and nonprinting areas of the lithographic master are located on substantially the same plane, problems are encountered in lithographic printing which are not experienced in other types of printing systems. The major consideration is the selective inking of the imaged areas of the printing plate while at the same time avoiding the transfer of ink to the nonimaged or background areas of the printing plate. This problem can be overcome by treating the background areas with an ink releasing material. After each successive printing sequence, this ink releasing capability of the non-printing areas must be refreshed by what is commonly referred to in the printing art as "dampening". Dampening comprises the treatment of these nonimaged areas with a so-called "fountain solution" containing essentially water or a mixture of water and alcohol (e.g., monohydric or polyhydric alcohols). Since the printing inks generally used in lithography are greasy, they are repelled by the relatively hydrophilic non-imaged areas whereas they are attracted to the relatively oleophilic imaged areas of the master. It is critical that the nonprinting areas remain receptive to the dampening solution and nonreceptive of the printing ink. It is also equally critical that the printing areas of the master remain receptive to ink and repellent to the dampening solution. With the exception of collotype printing systems all lithographic printing processes require dampening and inking for each printing cycle.

This periodic dampening of the printing master has been known to result in "flow back" of fountain solution into the train of ink rollers during the course of a printing run, thereby, causing emulsification of the ink on these rollers. Another problem inherent in the periodic dampening of the printing master is the "carry out" of fountain solution from such plates to the transfer sheet. Wetting of the transfer sheet with such fountain solutions can cause curling of the sheet, thus, making registration more difficult in the event that such sheet must undergo multiple trips through the press, as is often required in color printing.

The most popular of the planographic printing systems, (based upon commercial considerations), are "direct" and "off-set" lithography. In direct lithography, the ink image is transferred from the printing master directly to a receiving sheet. Offset lithography, on the other hand, involves transfer of the ink image from the lithographic master to a "blanket" or an "impression cylinder" which in turn conveys the ink image to a receiving sheet. While it is apparent that direct lithography provides a simpler printing system due to the absence of an intermediate transfer step, the presence of such a transfer medium does serve a highly desirable function in that it minimizes the "carry out" of a fountain solution from the printing master to the transfer sheet, thus, avoiding wetting of such sheets with fountain solution. The resilient nature of this blanket also enhances transfer image quality and minimizes abrasion of the image pattern on the master.

Until relatively recently, all lithographic printing systems have required some periodic dampening of the printing master between printing cycles in order to renew the ink repellency of the non-printing areas of the lithographic master. A number of lithographic printing systems have been disclosed which reportedly eliminate the need for such periodic dampening. These systems, hereinafter referred to as "waterless lithographic printing systems", base their reported success upon the discovery that certain materials (described as "abhesive" materials) have surface characteristics which defy acceptance of ink from an inking roller and yet are capable of undergoing selective modification (photomechanical or electrical etching) so as to render such modified areas ink receptive, U.S. Pat. No. 3,511,178.

More recently, a waterless lithographic printing system has been disclosed wherein an ink receptive image pattern is formed on an abhesive substrate by conventional electrostatographic imaging methods, German patent application OLS P 22 34 692.5, published Jan. 25, 1973. According to this publication, a photoconductive layer is overcoated with a thin film of abhesive material and the resulting structure charged and imaged in accord with standard electrostatographic techniques. The latent image thus formed on the abhesive surface of the structure is rendered visible by development with toner particles which upon fusion to this abhesive layer provide ink receptive characters on this ink releasing background. Other embodiments described in this publication include preparation of photoconductive binder layers wherein the ink releasing (abhesive) materials serve as a binder for a variety of photoconductive pigments (e.g. zinc oxide or anthracene). All of the resulting lithographic masters prepared in compliance with the teachings of this disclosure are reportedly useful in waterless lithographic printing systems and possess good resistance to image breakdown.

The principal reasons for the reported success of the above systems apparently reside in the surface characteristics of the abhesive material making up the image carrier. The extent to which such image carriers retain their ink releasing properties is dependent upon the maintenance of such favorable surface characteristics. The incorporation of sufficient quantitites of photoconductive pigments within such abhesive materials to render the resulting binder layer photoconductive can, however, result in adverse alteration in the ink releasing properties of such films. This is to be expected since as the concentration of such pigment in the binder increases, the composite layer begins to progressively take on the surface characteristics of the non-abhesive pigments incorporated therein.

It is, therefore, the principal object of this invention to provide a photoconductive lithographic printing master which does not suffer from the deficiencies experienced in such binder layer systems.

Accordingly, it is the object of this invention to provide a photoconductive lithographic printing master suitable for use in both offset and direct lithographic printing systems.

More specifically, it is the principal object of this invention to provide a photoconductive lithographic printing master wherein the ink receptive toner image is firmly adherent to the ink releasing substrate.

It is another object of this invention to provide a photoconductive lithographic printing master which can be prepared by standard electrostatographic techniques.

SUMMARY OF THE INVENTION

The above and related objects are realized by providing a planographic printing master comprising a conductive substrate having operatively disposed in relation thereto an ink releasing photoconductive insulating layer comprising a block copolymer consisting essentially of polymeric segments from a siloxane monomer and segments from a polymer selected from the group consisting of addition polymers and polycondensates wherein said addition polymers segments and said polycondensates polymer segments contain aromatic and/or heterocyclic constituents either appended from or integrated within the polymer backbone. These aromatic and/or heterocyclic constituents should be capable of providing said polymers with sites capable of (i) an electron donor function, (ii) an electron acceptor function or (iii) both an electron donor and an electron acceptor function. In those polymer systems wherein the aromatic and/or heterocyclic constituent is only capable of performing a single function, namely that of an electron acceptor or an electron donor, sufficient activator molecules are added to the block copolymer in preparation of the ink releasing layer to render said layer photoresponsive to visible light. Such activator molecules are optional where the aromatic and/or heterocyclic constituent is difunctional, namely that is capable of undergoing a charge transfer transition within the structural unit containing such constituent or capable of interaction with other monofunctional or difunctional sites on adjacent segments of the polymer. Especially preferred ink releasing photoconductive insulating layers which are useful in the preparation of the planographic printing masters of this invention comprise block copolymers of poly(dimethylsiloxane) and poly(α-methyl styrene) which have been sensitized by the addition of a strong electron acceptor.

DESCRIPTION OF THE INVENTION INCLUDING PREFERRED EMBODIMENTS

The photoconductive imaging layer of the lithographic master of this invention is prepared by forming a film from (1) a block copolymer containing polymeric segments from a siloxane monomer and polymeric segments from a non-siloxane monomer and (2) activator compounds, where appropriate. The quantity of polymeric materials deposited on the substrate should be sufficient to provide a dry film thickness in the range of from about 0.1 to about 100 microns.

The siloxane segment (hereinafter also referred to as the "soft segment") of the block copolymer comprises repeating units of organo-functional siloxanes having the following structural formula:

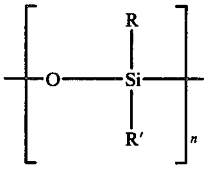

wherein

R and R' are independently selected from alkyl of 1 to 4 carbon atoms, halogenated alkyl of 1 to 4 carbon atoms or nitrile substituted alkyl of 1 to 3 carbon atoms; and $n$ is at least 25.

The average molecular weight of such soft segments of the block copolymer generally are in excess of 2000 and preferably in excess of $10^4$. Organo-functional siloxanes which are suitable for use in such block copolymers are generally readily available commercially or can be prepared by techniques and with apparatus disclosed in the technical literature. Especially preferred organo-functional siloxanes which can be used in preparation of the lithographic masters of this invention include poly(methylsiloxane), poly(dimethylsiloxane), poly (ethylsiloxane), and poly(diethylsiloxane). Although, the literature discloses that some aromatic substitution of the siloxane segment of the abhesive layer can be tolerated in a waterless lithographic printing environment (U.S. Pat. No. 3,511,178), such aromaticity is to be avoided since it can adversely alter the ink releasing properties of such siloxane polymers.

The non-siloxane segments of the block copolymer (hereinafter also referred to as the "hard segments" of the copolymer) can be prepared from any one or combination of addition polymers and polycondensates having aromatic and/or heterocyclic constituents. Of course, the greater the degree of aromatic and/or heterocyclic functionality within the polymer segment, the greater the likelihood of charge transfer interaction with activator molecules and the more favorable the charge carrier transport capability of the polymer. In the preferred embodiments of this invention, each structural unit of the hard segments of the block copolymer has at least one aromatic and/or heterocyclic constituent. Typical of the non-siloxane polymers which are suitable for use in such block copolymers include poly(styrene); poly(α-methylstyrene); poly(N-vinylcarbazole); poly(carbonate) resins comprising recurring units of the formula:

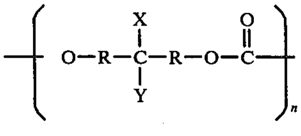

wherein each —R— is selected from the group consisting of phenylene, halo substituted phenylene, and alkyl substituted phenylene;

X and Y are each selected from the group consisting of hydrogen, hydrocarbon radicals free from aliphatic unsaturation and of radicals which together and with the adjoining

atom form a cycloalkane radical, the total number of carbon atoms in X and Y being up to 12, and

*n* is at least 2;

these resins being disclosed and methods for their preparation described in U.S. Pat. No. 3,408,186 which is hereby incorporated by reference; and poly(sulfone) resins comprising recurring units of the formula

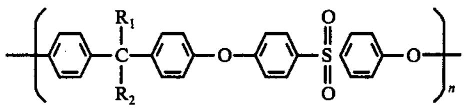

wherein $R_1$ and $R_2$ are independently selected from the group consisting of hydrogen and an alkyl radical having from 1 to about 12 carbon atoms; and

*n* is an integer having a value of at least 2;

these resins being disclosed and methods for their preparation described in U.S. Pat. No. 3,408,190 which is hereby incorporated by reference.

The range of significant spectral response of the above mono-functional non-siloxane polymers resides principally in the ultraviolet region of the electromagnetic spectrum. In order to shift the photoresponsiveness of such polymers into the visible region of the spectrum, it is necessary to incorporate within a matrix of such materials an activator; that is a Lewis Acids or other substance which is capable of formation of charge transfer complexes with the aromatic and/or heterocyclic constituents of these polymers. Especially preferred Lewis Acids which can form charge transfer complexes with the aromatic and/or heretocyclic constituents of such polymer segments include 2,4,7-trinitro-9-fluorenone, benzophenone tetracarboxylic acid dianhydride, tetrachlorophthalic anhydride, chloranil, picric acid, benz(a) anthracene - 7,12-dione, 1,3,5-trinitrobenzene and 2,3,-dichloro 1,4-naphthoquinone. Other Lewis Acids capable of forming charge transfer complexes with these polymers are disclosed in U.S. Pat. Nos. 3,408,186 and 3,408,190 previously incorporated by references. The concentration of Lewis Acid in the photoconductive ink releasing layer can range from about 10 to about 100 mole percent based upon the mole concentration of structural units having aromatic and/or heterocyclic constituents within each of the non-siloxane segments of such block copolymers.

Elastomeric compositions comprising block copolymers having soft and hard segments can be prepared from the above monomers by any one of a number of suitable methods disclosed in the technical literature. One of the more efficient of the reported methods for preparation of such block copolymers involves the addition of a cyclotrisiloxane to a "living" polymer (prepared by unterminated anionic polymerization techniques): J. C. Saam et al, *Properties of Polystyrene — Polydimethylsiloxane Block Copolymers,* I and EC Prod. Res. and Dev. 10, 10 (March 1971); F. W. Billmeyer, *Textbook of Polymer Science,* 2nd Edition, Chapters 10 and 11, Wiley — Interscience Publishers, (1971) and associated Bibliographies; and U.S. Pat. No. 3,665,052 — which is hereby incorporated by reference. The addition of the cyclotrisiloxane to the still active polymer leads to the formation of block copolymers which are substantially free from contamination by homopolymer fractions. Preparation of a typical elastomeric block copolymer by the above techniques involves combining (in a suitable solvent) a "living polymer" of one or more of the above non-siloxane polymers and an organo-functional cyclotrisiloxane, such an hexamethylcyclotrisiloxane. This technique leads to what is commonly known as diblock copolymers. The use of a difunctional "living" polymer leads to tri-block copolymers. Condensation of the siloxanolate or corresponding silanol-ended polymers by known methods of siloxane chain extension leads to multiblock copolymers. Block copolymers derived from condensation polymer hard segments are generally prepared by condensation of the separately prepared siloxane segments with either the separately prepared hard segments or their monomers. Representative of these techniques is the preparation of siloxane-carbonate block copolymers as described by H. A. Vaughn, *J. Poly. Sci.,* Part B, 7, 569 (1969)., R. Kambour, ibid, 7, 573 (1969)., and H. A. Vaughn, U. S. Pat. No. 3,189,662 (1965). A further example is the preparation of siloxanesulfone block copolymers is described by A. Noshay, N. Matzner & C. N. Merriam, *J. Poly. Sci.,* Part A — 1, 9, 3147 (1971).

Representative of suitable elastomeric materials reportedly prepared by the above method are the multiblock copolymers of poly(dimethylsiloxane) and poly-($\alpha$-methylstyrene), (available from Dow Corning Corporation of Midland, Michigan). Ordinarily, the relative concentration of hard segments to soft segments within the block copolymer can be readily adjusted for optimization of mechanical and/or photoconductive properties. The relative weight ratio of hard to soft segments in such block copolymers can range from 75:25 to 5:95, and preferably from 25:75 to 5:95.

The relative concentration and physical properties of the individual segments of the block copolymer must be controlled so as to insure that the resulting copolymer is a heterophase elastomeric material having little if any chemical crosslinking of the copolymer chains. The soft segment must have a glass transition temperature below ambient temperature so that viscous flow can occur in the soft segment phase. The hard segment must have a glass transition temperature above ambient temperature so that viscous flow does not occur in this phase. The hard segment phase thus acts as the tiepoints between polymer chains achieved in more conventional elastomers by chemical crosslinks. In order for the individual polysiloxane segments to phase separate they must have an average molecular weight of about 2,000 or greater. The relative molecular weight of the individual hard segments of the block copolymer can vary considerably depending upon the specific monomer used in that preparation. Poly-$\alpha$-methylstyrene segments satisfying the above criteria generally have a molecular weight as low as 2,000. With polycarbonate segments the molecular weight may be as low as about 500.

In an alternative embodiment of this invention, a film of this block copolymer can also contain very small amounts (from about 1 to 10 weight percent based upon the concentration of hard segments of the block copolymer) of photoconductive pigments having a range of spectral response beyond the range of substantial spectral response of the non-siloxane segments of the block copolymer. The principal advantage of such a structure is that it provides a system in which it is possible to separate carrier generation (photoconductive pigment) and transport (block copolymer) functions within the film when the image information is only activating of the carrier generation species within the layer. Similar results are obtained where the image carrier comprises a composite structure having a layer of block copolymer superimposed over a photoconductive insulating layer.

An abhesive polymeric composition of the type previously described can be formed on a conductive (preferably flexible) substrate by any of the techniques traditionally used in the film casting or the coating arts (e.g. dip, draw or spray coating). The dry film thickness of such films can range anywhere from about 0.1 to about 100 microns and preferably from about 2 to about 50 microns; film thickness generally being dictated by durability requirements of the master and the amount of deformation such films undergo during inking and transfer. Typical of the substrates which are satisfactory for fabrication of photoconductive printing masters of this invention include aluminum; chromium; metallized plastic films; metal coated plastic films (e.g. aluminized Mylar); and conductive glass plates (e.g. NESA glass). Subsequent to forming a photoconductive film of the desired thickness of the conductive substrate, the film is allowed to dry until substantially free of residual solvents used in its fabrication. The imaging layer of the resulting member is thereafter sensitized by charging with a corotron of the appropriate polarity; image information projected onto this sensitized imaging surface at a wavelength capable of activating the carrier generating centers of said imaging layer; and the latent image thus produced developed with thermoplastic toner particles. In the event that carrier generation and transport functions are performed by separate components of the imaging layer, the polarity of the sensitizing charge and the wavelength at which the image information is projected onto said sensitized layer must be selected so as to provide for rapid and substantially complete discharge of the charge in the light struck areas on said sensitized layer.

The ink receptive toner used in development of the latent electrostatic image can be almost virtually any thermoplastic material which is both compatible with electrostatographic imaging techniques and which upon fusion to the photoconductive imaging layer provides an ink receptive image pattern. With regard to this latter requirement, it is generally preferable to select materials which are chemically similar to the hard segments of the block copolymer used in preparation of the ink releasing layer results in better adhesion of the image to said layer. Such enhanced adhesion is highly desirable in order to avoid the type of image breakdown which can occur during the use of such imaged member in direct and offset lithographic printing processes. Especially preferred thermoplastic toner materials which satisfy the above requirements are toners containing polymers of styrene and substituted styrene and their copolymers.

The Examples which follow further define, describe and illustrate preparation of the planographic printing masters of this invention. Techniques and apparatus used in preparation and evaluation of these masters are presumed to be standard or as hereinbefore described. Parts and percentages appearing in such Examples are by weight unless otherwise stipulated.

EXAMPLE I

A planographic printing master is prepared by solvent casting a chloroform dispersion of 100 parts by weight of a block copolymer of poly(dimethylsiloxane)/poly($\alpha$-methyl styrene) — relative mole ratio 60:40 — and 60 parts by weight 2,4,7-trinitro-9-fluorenone on a ball grained flexible aluminum plate. The amount of dispersion transferred to said plate is sufficient to form a layer having a dry film thickness of about 50 microns. Following evaporation of residual chloroform from said layer, the resulting plate is charged in the dark to a positive potential of about 600 volts in a Xerox Model D processor and subsequently exposed through a Xerox #4 camera at *f* 16 for 12 seconds. The source of illumination of said image is a tungsten lamp. The latent electrostatic image thus formed on the plate is developed by cascading a developer composition comprising a poly(styrene-cobutylmethacrylate) toner. The toner image is then fused to the plate with a radiant fuser. The resulting image carrier is inserted in a standard offset lithographic press and the press run without periodic dampening between each printing cycle. The ink used in the lithographic press is available from Pope & Grey Division of Martin Marietta Corporation, Clifton, New Jersey (Pope & Grey #2441 Lithographic Ink). After about 500 prints have been prepared from this lithographic master, both the prints and the master are examined. The particulate image pattern on the lithographic master appears to be intact and the background areas of the prints have remained clean throughout the entire printing run.

EXAMPLE II–V

The procedures of Example I are repeated except the ink releasing photoconductive insulating layer is cast from a solution comprising 100 parts by weight of block copolymer and 5 parts by weight photoconductive pigment. The plate thus prepared is sensitized as previously described, however, the wavelength of the source of illumination of the image pattern is controlled with the appropriate band pass filter so as to correspond to the wavelength of maximum photoresponse of the photoconductive pigment. The table which follows provides a list of pigments which can be incorporated into the above block copolymer and the appropriate wavelength used in illumination of the image information.

TABLE I

| EXAMPLE NO. | PIGMENT | WAVELENGTH OF PEAK PHOTORESPONSE |
|---|---|---|
| II | cadmium sulfide | 450 – 500 millimicrons |
| III | cadmium sulfoselenides | 640 millimicrons |
| IV | x-metal free phthalocyanine | 625 millimicrons |
| V | selenium | 420 millimicrons |

What is claimed is:

1. A photoconductive planographic printing master comprising:

(a) a conductive substrate;

(b) a photoconductive ink releasing layer operatively disposed in relation to said substrate, said layer comprising 2,4,7-trinitro-9-fluorenone and a block copolymer of soft poly(dimethylsiloxane) segments and hard poly(α-methylstyrene) segments, the relative weight ratio of hard polymer segments to soft polymer segments in said copolymer being in the range of from about 75:25 to about 5:95; and (c) an ink receptive image pattern affixed to the surface of said photoconductive layer, said pattern comprising a thermoplastic polymeric material including styrene and/or substituted styrene segments.

2. The photoconductive planographic printing master of claim, 1 wherein the relative weight ratio of hard polymer segments to soft polymer segments is in the range of from about 25:75 to about 5:95.

3. The photoconductive planographic printing master of claim 1, wherein the ink releasing layer contains from about 1 to about 10 weight percent photoconductive pigment having a range of spectral response beyond the range of photoresponsiveness of the block copolymer.

* * * * *